United States Patent
Pichler et al.

(10) Patent No.: US 7,078,726 B2
(45) Date of Patent: Jul. 18, 2006

(54) SEALING OF ELECTRONIC DEVICE USING ABSORBING LAYER FOR GLUE LINE

(75) Inventors: Karl Pichler, Admont (AT); Kyle D. Frischknecht, Livermore, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/939,250

(22) Filed: Sep. 9, 2004

(65) Prior Publication Data

US 2006/0049396 A1    Mar. 9, 2006

(51) Int. Cl.
*H01L 35/24* (2006.01)

(52) U.S. Cl. .................. 257/40; 398/121; 398/124; 398/125; 398/128; 398/132

(58) Field of Classification Search .............. 398/121, 398/124, 125, 128, 132
See application file for complete search history.

(56) References Cited

U.S. PATENT DOCUMENTS

| 5,874,804 A | 2/1999 | Rogers |
| 6,952,530 B1 * | 10/2005 | Helvajian et al. ........... 398/128 |

* cited by examiner

*Primary Examiner*—Mai-Huong Tran
(74) *Attorney, Agent, or Firm*—Fish & Richardson P.C.

(57) ABSTRACT

In one embodiment of the invention, a first absorbing layer is on a substrate and/or a second absorbing layer is on a heat-activated adhesive. If the IR source that supplies IR radiation is present on the substrate-side, then the absorption percentage of the substrate is less than the absorption percentage of the first absorbing layer if present and less than the absorption percentage of the second absorbing layer if present. If the IR source that supplies IR radiation is present on the "encapsulation cover"-side, then the absorption percentage of the encapsulation cover is less than the absorption percentage of the first absorbing layer if present and less than an absorption percentage of the second absorbing layer if present. The substrate and the encapsulation cover have a low thermal conductivity.

24 Claims, 8 Drawing Sheets

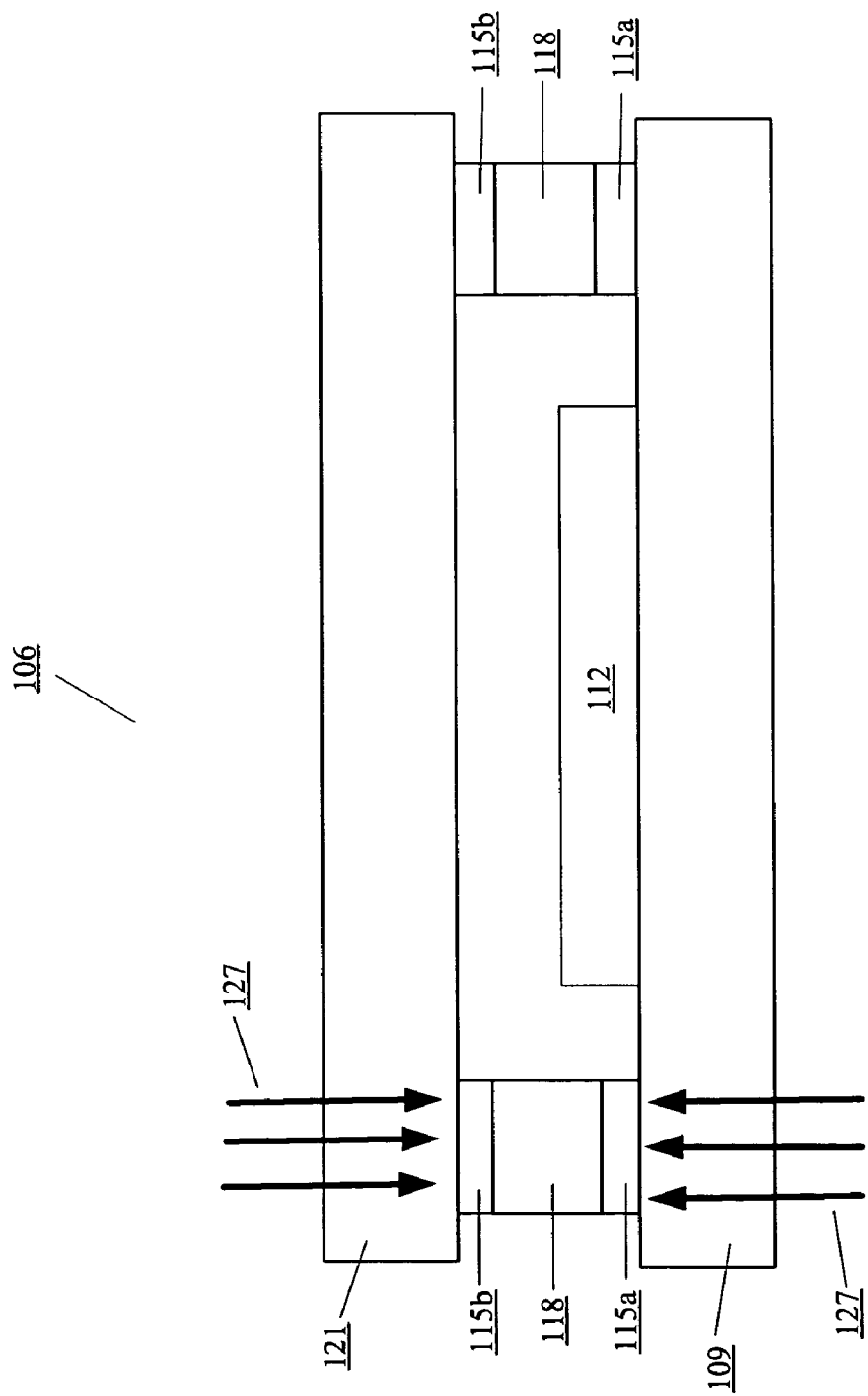

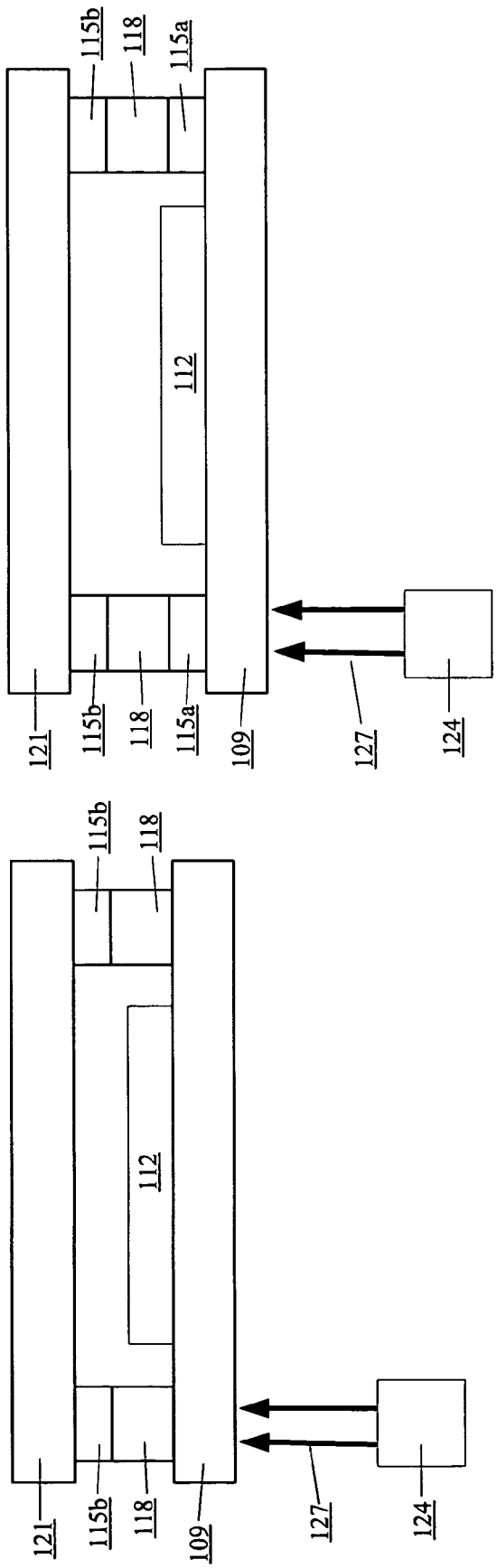

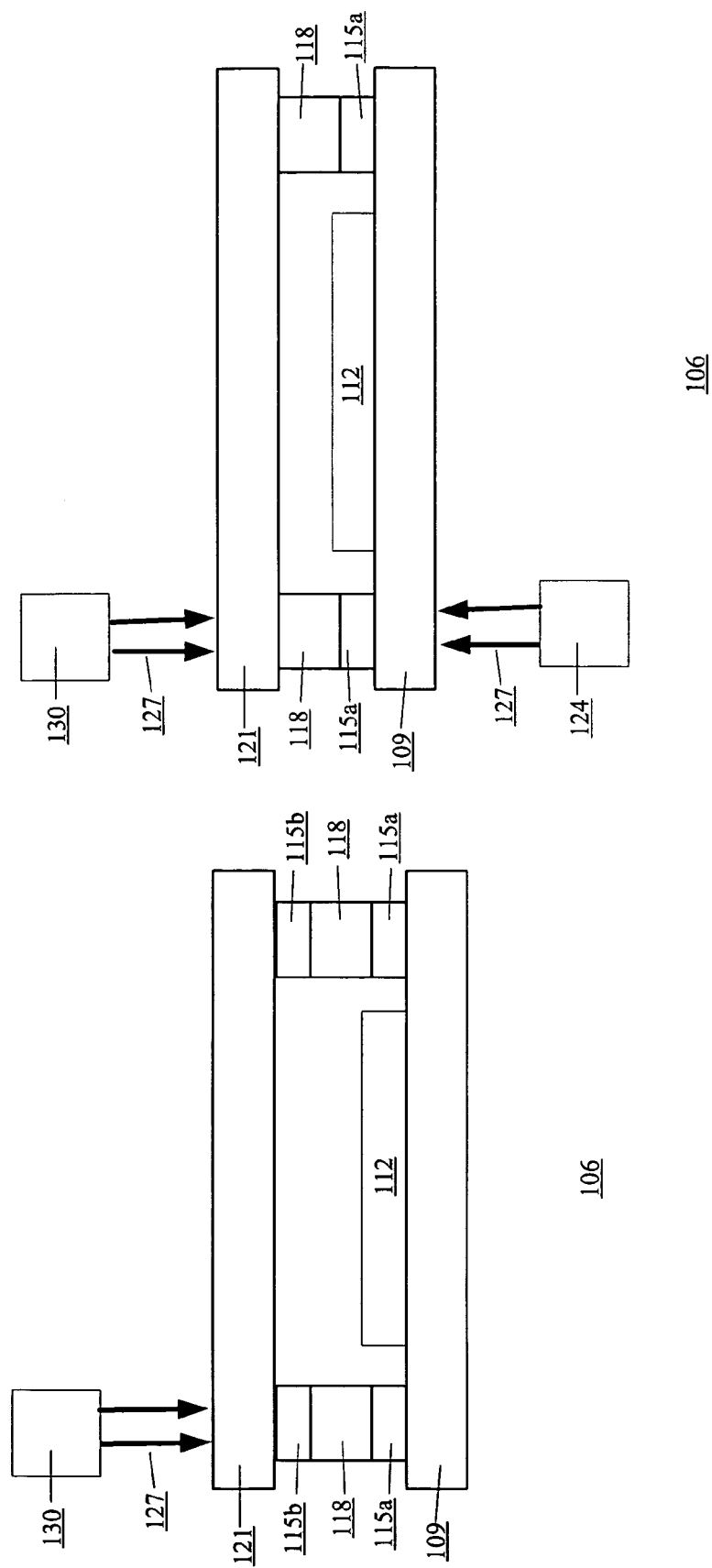

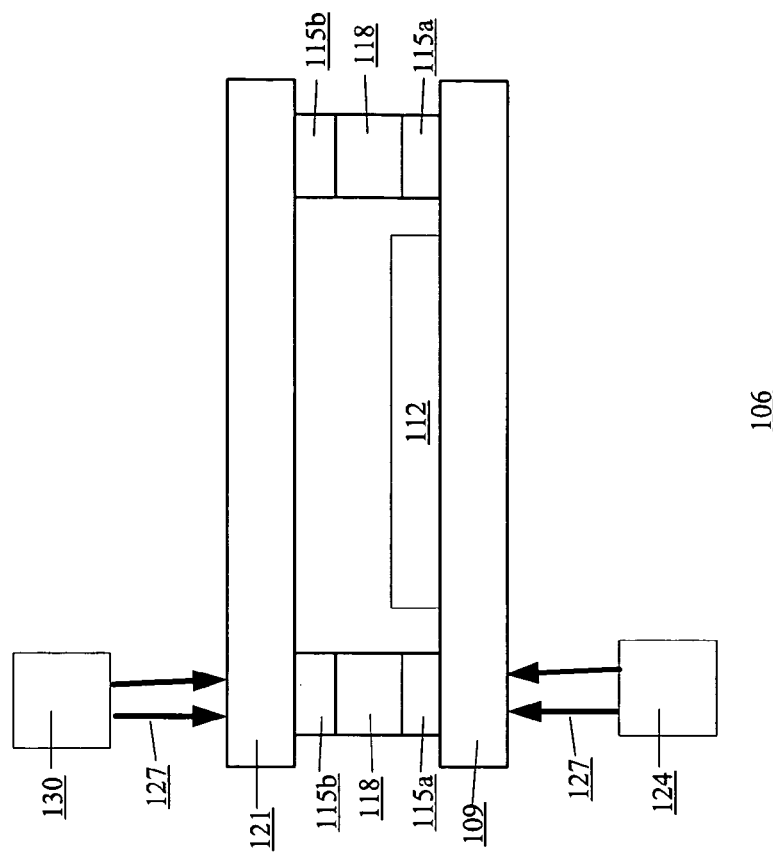
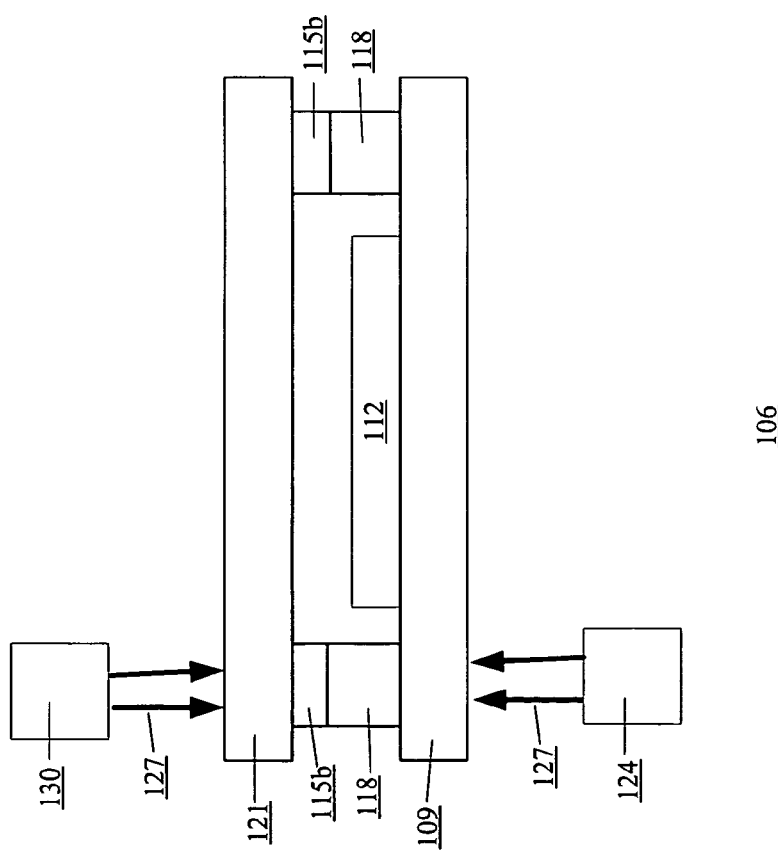

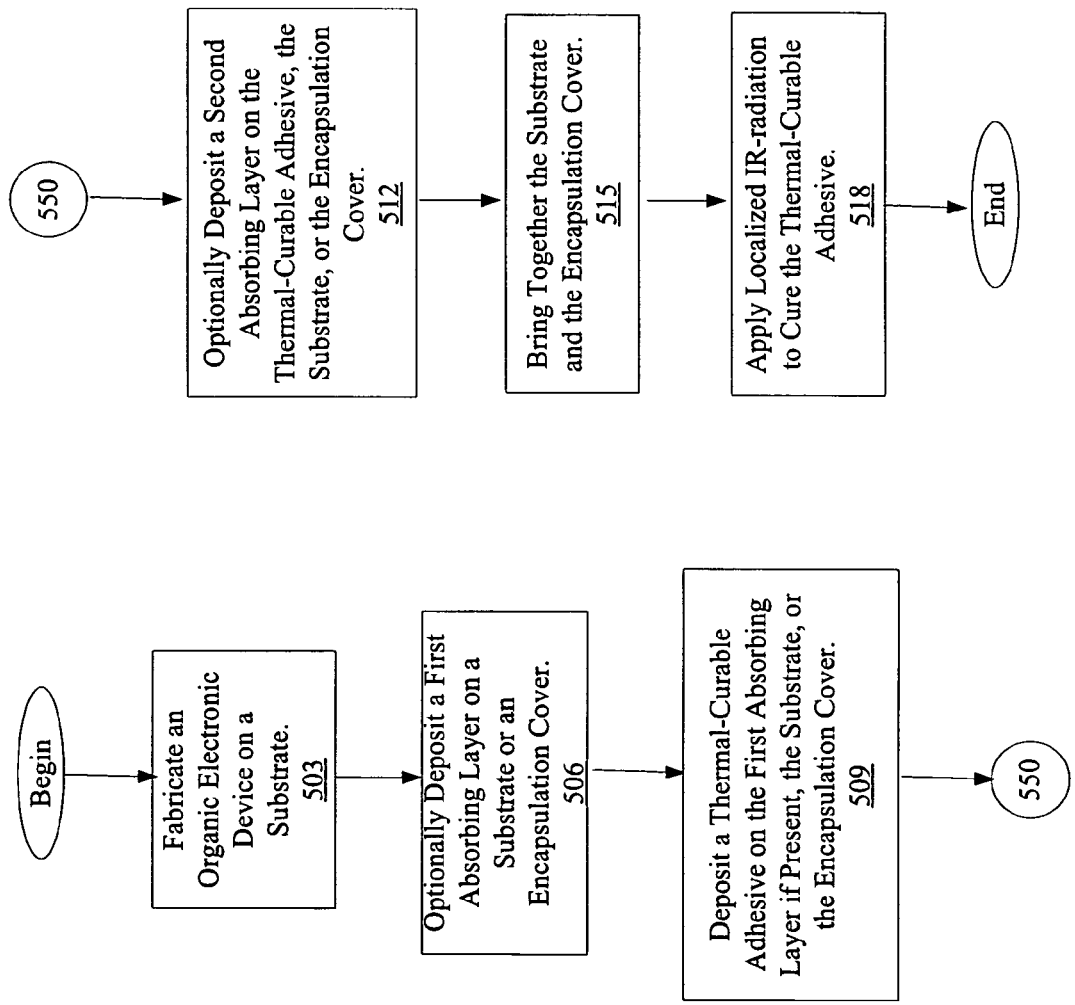

SEALING OF ELECTRONIC DEVICE USING ABSORBING LAYER FOR GLUE LINE

BACKGROUND OF THE INVENTION

An organic electronic device such as, for example, an organic light emitting diode ("OLED") display, an OLED light source for area illumination, an organic light sensor array, an organic transistor array, or an organic solar cell array require protection from oxygen and moisture in the atmosphere, and therefore employ some form of encapsulation. One common procedure to encapsulate the organic electronic device is to sandwich it between a substrate and an encapsulation cover, and an adhesive around the perimeter of the device holds together the substrate and the encapsulation cover such that there is a continuous perimeter seal around the device.

Typically, the substrate and the encapsulation cover are sealed together using UV-curable adhesive or thermal-cure adhesive. In many cases, use of the thermal-cure adhesive would be advantageous. Thermal-cure adhesive provides many advantages such as good performance and predictable results due to the maturity of the technology. The thermal-cure adhesive needs to be heated to a high temperature in order to cure it. Because of the thickness of the substrate and/or the encapsulation cover (e.g., the thickness can vary from tens of microns to over one millimeter), the substrate and/or the encapsulation cover can be efficient absorbers of the infrared ("IR") radiation supplied to cure the thermal-cure adhesive and therefore a substantial part of the IR radiation supplied to cure the thermal-cure adhesive can be absorbed by these components thus these components are exposed to high temperatures. The absorption of the supplied IR radiation can damage, for example, the organic active layers of the electronic device, the substrate, and/or the encapsulation cover. In the case of the substrate and/or the encapsulation cover, the heating to the high temperatures can cause these components to become warped.

For the foregoing reasons, there exists a need to encapsulate the organic electronic device using thermal-cure adhesive without damaging components of the encapsulated device such as the organic active layers, the substrate, and/or the encapsulation cover.

SUMMARY

An embodiment of an encapsulated organic electronic device is described that includes: a substrate, an organic electronic device on the substrate, and a heat-activated adhesive that is on the substrate and surrounds a perimeter of the organic electronic device. The electronic device also includes an encapsulation cover that is on the heat-activated adhesive. A first absorbing layer is between the substrate and the heat-activated adhesive and is in proximity to the adhesive. In addition or alternatively, a second absorbing layer is between the encapsulation cover and the adhesive and is in proximity to the adhesive. If an IR source that supplies IR radiation is on a substrate-side, then an IR radiation absorption percentage of the substrate is less than an absorption percentage of the first absorbing layer if present and less than an absorption percentage of the second absorbing layer if present. If another IR source is on an "encapsulation cover"-side, then an absorption percentage of the encapsulation cover is less than an absorption percentage of the first absorbing layer if present and less than an absorption percentage of the second absorbing layer if present.

BRIEF DESCRIPTION OF THE DRAWINGS

FIG. 1 shows a cross-section of an embodiment of an encapsulated organic electronic device according to the present invention.

FIG. 2b shows a second configuration of the embodiment of the system used to produce the encapsulated organic electronic device according to the present invention.

FIG. 2c shows a third configuration of the embodiment of the system used to produce the encapsulated organic electronic device according to the present invention.

FIG. 2f shows a sixth configuration of the embodiment of the system used to produce the encapsulated organic electronic device according to the present invention.

FIG. 2g shows a seventh configuration of the embodiment of the system used to produce the encapsulated organic electronic device according to the present invention.

FIG. 2h shows an eighth configuration of the embodiment of the system used to produce the encapsulated organic electronic device according to the present invention.

FIG. 2i shows a ninth configuration of the embodiment of the system used to produce the encapsulated organic electronic device according to the present invention.

FIG. 4 is a flowchart that shows an embodiment of a method to encapsulate the organic electronic device according to the present invention.

DETAILED DESCRIPTION

Figure 2A:
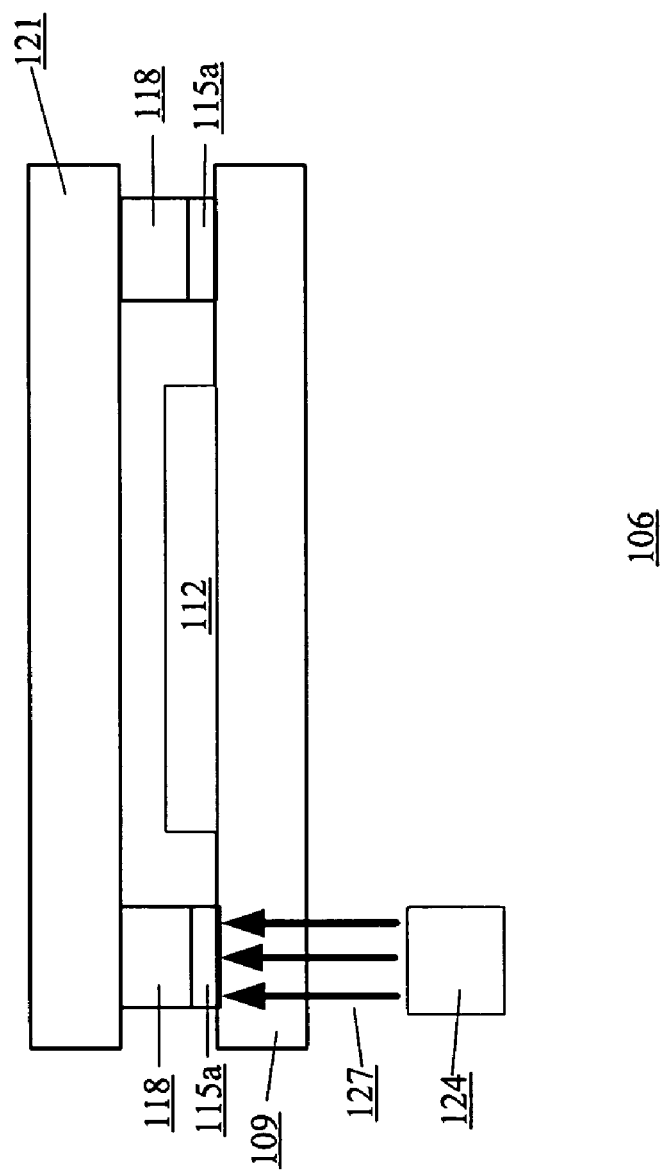
FIG. 2a shows a first configuration of the embodiment of the system used to produce the encapsulated organic electronic device according to the present invention.

In an embodiment of this invention, a first absorbing layer is on a substrate and/or a second absorbing layer is on a heat-activated adhesive. If the IR source that supplies IR radiation is present on a substrate-side, then an absorption percentage of the substrate is less than an absorption percentage of the first absorbing layer if present and less than an absorption percentage of the second absorbing layer if present. If the IR source that supplies IR radiation is present on an "encapsulation cover"-side, then an absorption percentage of the encapsulation cover is less than an absorption percentage of the first absorbing layer if present and less than an absorption percentage of the second absorbing layer if present. The substrate and the encapsulation cover have a low thermal conductivity. When the substrate and the encapsulation cover are brought together so as to seal the organic electronic device, the first absorbing layer if present is in proximity to the heat-activated adhesive and the second absorbing layer if present is in proximity to the heat-activated adhesive. Because the absorbing layer(s) that are present have a higher absorption percentage than the substrate and/or the encapsulation cover, more of the IR radiation reaches the absorbing layer(s) and since the absorbing layer(s) are in proximity to the heat-activated adhesive, more IR radiation is transferred to the heat-activated adhesive.

FIG. 1 shows a cross-section of an embodiment of an encapsulated organic electronic device 106 according to the present invention. In FIG. 1, an organic electronic device 112 is on a substrate 109. As used within the specification and the claims, the term "on" includes when devices, components, or layers are in physical contact and when devices, components, or layers are separated by one or more intervening layers. Optionally, an absorbing layer 115a is on the substrate 109. A heat-activated adhesive 118 is on the substrate 109, or on the absorbing layer 115a if present. Optionally, an absorbing layer 115b is on the heat-activated adhesive 118. The absorbing layer 115a if present, the heat-activated adhesive 118, and the absorbing layer 115b if present are all around the perimeter of the organic electronic device 112. At least one of the absorbing layers 115a, b is present in the encapsulated organic electronic device 106. One or more IR sources supply localized IR radiation 127 that is absorbed by the absorbing layer 115a if present and the absorbing layer 115b if present and the resulting heat is transferred from the absorbing layer(s) to the heat-activated adhesive 118 in order to cure it. These components are described in greater detail below.

Substrate 109:

The substrate 109 supports the organic electronic device 112 and protects the organic electronic device (e.g., the organic layers) from moisture and oxygen. The substrate 109 is transparent or opaque (e.g., if the IR source that supplies IR radiation is not on the substrate-side, then the substrate 109 can be opaque). The substrate 109 can be comprised of, for example, glass, quartz, or plastic; preferably, the substrate 109 is comprised of glass. The preferred thickness of the substrate 109 depends on the material used and the specific application of the device; for example, the thickness of the substrate 109 can range from tens of microns to approximately one millimeter. The substrate 109 has low thermal conductivity. For example, the thermal conductivity of the substrate 109 is within the range of about 0.1 W/mK to about 10 W/mK. If the IR source that supplies IR radiation is present on the substrate-side, then the IR radiation absorption percentage of the substrate 109 is less than the absorption percentage of the absorbing layer 115a if present and the absorption percentage of the absorbing layer 115b if present. Preferably, the absorption percentage of the IR radiation of the substrate 109 is less than 50%, and more preferably, it is less than 10%. Materials such as, for example, glass have the desirable absorption percentage.

Organic Electronic Device 112:

The organic electronic device 112 is a device that, for example, includes an anode, a cathode, and at least one organic layer between the anode and the cathode; the at least one organic layer includes an organic active layer. Alternatively, rather than an anode and a cathode, the contacts can be a source, drain, and gate. Examples of organic electronic devices are an OLED display, an OLED light source for area illumination, an organic light sensor array, an organic transistor array, or an organic solar cell array.

Absorbing Layers 115a, b:

One or both of the absorbing layers 115a,b are present in the encapsulated organic electronic device 106. The absorbing layers 115a,b absorb at least a substantial percentage of the received IR radiation; for example, the absorbing layers 115a,b absorb at least 50% of the IR radiation received, preferably, they absorb at least 70% of the IR radiation. The absorbing layers 115a,b have good adhesion to the substrate 109, the encapsulation cover 121, and/or the heat-activated adhesive 118. If the heat-activated adhesive 118 has a high thermal conductivity, then the absorbing layer(s) 115a,b cover at least a portion of the heat-activated adhesive 118; otherwise, if the heat-activated adhesive 118 has a low thermal conductivity, then the absorbing layer(s) 115a,b cover at least a substantial portion of the heat-activated adhesive 118.

The absorbing layer(s) 115a,b can be made of, for example: metals (e.g., tungsten, chromium, tantalum, titanium, and molybdenum), alloys (e.g., an aluminum and silicon alloy), carbon, amorphous carbon, absorbing organic materials (e.g., thermal-cure or UV-cure epoxy glue), semiconductors (e.g., silicon, amorphous silicon, or poly silicon), dielectrics doped with absorbing materials, sub-stoichioimetric dielectrics, nitrides (e.g., titanium nitride), or a photoresist layer.

Also, the absorbing layer(s) 115a,b can be made of materials whose surface properties can be modified prior to encapsulation to increase absorption and/or reduce reflection of the IR radiation. Examples of such modification include exposure to light and/or chemicals, or mechanical action such as physically roughening the material.

In addition, anti-reflection coatings or layers can be deposited on one or both absorbing layers 115a,b in order to, for example, minimize reflection of the IR radiation.

Heat-Activated Adhesive 118:

The heat-activated adhesive can be a thermal-cure epoxy (e.g., a thermal-cure organic epoxy or a thermal-cure organo-metallic epoxy in which the epoxy is single component or multi-component), a compound that is initially in a fluid phase (e.g., liquid or paste) and is converted by heat to a solid amorphous or crystalline phase compound (e.g., a silicon-based compound), glass, glass-frit, a solder (e.g., a metal or an alloy), or a glue that is at least partially cured by heat.

When the heat-activated adhesive 118 is exposed to IR radiation, if the absorbing layer 115a is present, the heat-activated adhesive 118 may react with the absorbing layer 115a to produce an intermixed layer between the absorbing layer 115a and the heat-activated adhesive 118; and if the absorbing layer 115b is present, the heat-activated adhesive 118 may react with the absorbing layer 115b to produce another intermixed layer between the heat-activated adhesive 118 and the absorbing layer 115b.

The heat-activated adhesive 118 can at least substantially absorb the IR radiation, or alternatively, the heat-activated adhesive 118 at least partially absorbs the IR radiation or only minimally absorbs the radiation. By using one or both absorbing layers 115a,b, the heat-activated adhesive 118 can be chosen primarily for its bonding capability rather than its IR absorbing capability.

Optionally, a two-stage sealing process can be used where in an earlier stage, prior to completely curing the heat-activated adhesive 118, the adhesive is spot-cured. For example, the corners of the seal frame of the larger substrate (e.g., this is the substrate before singulation on which are multiple electronic devices) can be spot-cured, a pattern on the seal frame of the larger substrate can be spot-cured, or the corners of the seal frame of each individual electronic device can be spot-cured. Spot-curing can be used to, for example, minimize or avoid warpage.

Encapsulation Cover 121:

The encapsulation cover 121 covers the organic electronic device 112 and protects the device from oxygen and moisture. The encapsulation cover 121 is transparent or opaque (e.g., if the IR source that supplies IR radiation is not on the "encapsulation cover"-side, then the encapsulation cover 121 can be opaque). The encapsulation cover 121 can be comprised of, for example, glass, quartz, or plastic; preferably, the encapsulation cover 121 is comprised of glass. The preferred thickness of the encapsulation cover 121 depends, in part, on the material used and the specific application of the device; for example, the thickness of the encapsulation cover 121 can range from 10 micrometers to 5 millimeters, preferably, the thickness ranges from 0.1 millimeters to 1.0 millimeters. The encapsulation cover 121 has low thermal conductivity. For example, the thermal conductivity of the encapsulation cover 121 is within the range of 0.1 W/mK to 10 W/mK. If an IR source that supplies IR radiation is present on the "encapsulation cover"-side, then the absorption percentage of the IR radiation of the encapsulation cover 121 is less than the absorption percentage of the absorbing layer 115a if present and the absorption percentage of the absorbing layer 115b if present. Preferably, the absorption percentage of the IR radiation of the encapsulation cover 121 is less than 50%, preferably, less than 10%. Materials such as, for example, glass have the desirable absorption percentage.

IR Source:

The IR source supplies the IR radiation 127 that is absorbed by the absorbing layer(s) 115a,b. The IR source can be, for example, a localized IR source such as an IR laser (e.g., a semiconductor laser, a gas laser (e.g., a carbon dioxide laser), or a metal vapor laser), an IR LED, a hot object (e.g., a heated filament, a heated bar, or a patterned hot plate/stamp/stencil that is pressed against the substrate 109 and/or the encapsulation cover 121 over the areas in which the heat-activated adhesive is present). The IR radiation is applied to the entire seal frame (e.g., the heat-activated adhesive 118) by, for example, moving the electronic device (e.g., in this case, the electronic device is placed on an x-y stage and the stage moves the device under a fixed localized IR source), moving the localized IR source, or by scanning optics.

Alternatively, the IR source can be an IR flood source. In one configuration, the flood source is an areal IR source that supplies IR radiation in the x-y direction, and IR absorbing or reflecting masks are employed so that the IR radiation is localized/patterned so that substantially only the heat-activated adhesive 118 and/or the absorbing layer is exposed to the IR radiation 127. In another configuration, the flood source is a scanned linear source; the scanned linear source supplies a line of IR radiation. Again, masks are employed to produce localized IR radiation so that substantially only the heat-activated adhesive 118 and/or the absorbing layer is exposed to the IR radiation 127. The IR radiation is swept across the entirety of the device (including across the seal frame) by either moving the electronic device across the scanned linear source (e.g., the electronic device is on an x-y stage and the device is moved across a fixed linear source), or by moving the scanned linear source across the electronic device (e.g., the electronic device is in a fixed position and the linear source is moved across the electronic device).

Alternatively, the IR source can be a patterned IR source that supplies patterned IR radiation. Masks and/or optics can be used so that the supplied IR radiation is patterned. The patterned IR source can step from one electronic device to another, or alternatively, the devices are moved across a fixed patterned IR source. Alternatively, the IR source can supply a pulsed beam that is scanned in order to cure the seal frame.

FIG. 2a shows a first configuration of the embodiment of the system used to produce the encapsulated organic electronic device 106 according to the present invention. In this configuration, the absorbing layer 115a is on the substrate 109 around the perimeter of the organic electronic device 112, and the heat-activated adhesive 118 is on the absorbing layer 115a around the perimeter of the organic electronic device 112. The encapsulation cover 121 is on the heat-activated adhesive 118. In one scenario, the absorbing layer 115a is deposited on the substrate 109 around the perimeter of the organic electronic device 112. The heat-activated adhesive 118 is deposited on the encapsulation cover 121 such that when the substrate 109 and the encapsulation cover 121 are brought together so as to seal the organic electronic device 112, the heat-activated adhesive 118 is around the perimeter of the organic electronic device 112. Alternatively, instead of depositing the absorbing layer 115a on the substrate 109 and depositing the heat-activated adhesive 118 on the encapsulation cover 121, the absorbing layer 115a and the heat-activated adhesive 118 can be deposited on other components and in other sequences. For example, in another scenario, the absorbing layer 115a can be deposited on the substrate 109 and the heat-activated adhesive 118 can be deposited on the absorbing layer 115a. In yet another scenario, the heat-activated adhesive 118 can be deposited on the encapsulation cover 121 and the absorbing layer 115a can be deposited on the heat-activated adhesive 118.

The absorbing layer 115a can be deposited using selective or non-selective deposition techniques. For example, the absorbing layer 115a can be deposited using selective deposition techniques such as, for example, any printing technique that is suitable for depositing the layer in a patterned manner with adequate precision; examples of such printing techniques include screen printing, ink-jet printing, or dispensing through a needle of a syringe. Alternatively, the absorbing layer 115a can be deposited using non-selective uniform deposition techniques such as spin coating, thermal evaporation, sputtering, or chemical vapor deposition; if a non-selective deposition technique is used, then a subsequent removal or patterning step (e.g., laser ablation or photolithography process) is employed to remove the absorbing material from certain areas. Similarly, the heat-activated adhesive 118 can be deposited using selective deposition techniques (e.g., any printing technique that is suitable for depositing the adhesive in a patterned manner with adequate precision; examples of such printing techniques include screen printing, ink-jet printing, or dispensing through a needle of a syringe), or alternatively, deposited using non-selective deposition techniques (e.g., spin coating, thermal evaporation, sputtering, or chemical vapor deposition) and a subsequent removal step.

In FIG. 2a, the IR source is localized IR source 124 located on the substrate-side of the encapsulated electronic device 106 and it supplies IR radiation 127 that is at least substantially transmitted through the substrate 109 and is at least substantially absorbed by the absorbing layer 115a. Due to the proximity of the absorbing layer 115a to the heat-activated adhesive 118, the heat absorbed by the absorbing layer 115a is at least partially transferred to the heat-activated adhesive 118. So that a greater percentage of the supplied IR radiation is absorbed by the absorbing layer 115a rather than the substrate 109, the absorption percentage of the IR radiation of the substrate 109 is less than the absorption percentage of the absorbing layer 115a; preferably, the absorption percentage of the substrate 109 is less than 50%, and more preferably, it is less than 10%. The substrate 109 and the encapsulation cover 121 have low thermal conductivity.

FIG. 2b shows a second configuration of the embodiment of the system used to produce the encapsulated organic electronic device 106 according to the present invention. In this configuration, the heat-activated adhesive 118 is on the substrate 109 around the perimeter of the organic electronic device 112, and the absorbing layer 115*b* is on the heat-activated adhesive 118 around the perimeter of the organic electronic device 112. The encapsulation cover 121 is on the absorbing layer 115*b*. In one scenario, the heat-activated adhesive 118 is deposited on the substrate 109 around the perimeter of the organic electronic device 112, and the absorbing layer 115*b* is deposited on the heat-activated adhesive 118 around the perimeter of the organic electronic device 112. Alternatively, instead of depositing the heat-activated adhesive 118 on the substrate 109 and then the absorbing layer 115*b* on the heat-activated adhesive 118, the heat-activated adhesive 118 and the absorbing layer 115*b* can be deposited on other components and in other sequences. For example, in another scenario, the heat-activated adhesive 118 is deposited on the substrate 109 around the perimeter of the organic electronic device 112, and the absorbing layer 115*b* is deposited on the encapsulation cover 121 such that when the substrate 109 and the encapsulation cover 121 are brought together so as to seal the organic electronic device 112, the absorbing layer 115*b* is around the perimeter of the organic electronic device 112. In yet another scenario, the absorbing layer 115*b* can be deposited on the encapsulation cover 121 and the heat-activated adhesive 118 can be deposited on the absorbing layer 115*b* and these two are deposited such that when the substrate 109 and the encapsulation cover 121 are brought together so as to seal the organic electronic device 112, the absorbing layer 115*b* and the heat-activated adhesive 118 are around the perimeter of the organic electronic device 112.

The absorbing layer 115*b* can be deposited using the selective or non-selective deposition techniques described earlier for the deposition of the absorbing layer 115*a*. Similarly, the heat-activated adhesive 118 can be deposited using the selective or non-selective deposition techniques described earlier.

In FIG. 2*b*, the IR source is localized IR source 124 located on the substrate-side of the encapsulated electronic device 106 and it supplies IR radiation 127 that is at least substantially transmitted through the substrate 109, and at least some of this radiation may be absorbed by the heat-activated adhesive 118. The IR radiation that is transmitted through the heat-activated adhesive 118 is at least substantially absorbed by the absorbing layer 115*b* and due to the absorbing layer's proximity to the heat-activated adhesive 118, the heat is at least substantially transferred back to the heat-activated adhesive 118. The substrate 109 has the absorption and thermal conductivity properties described earlier for FIG. 2*a*.

FIG. 2*c* shows a third configuration of the embodiment of the system used to produce the encapsulated organic electronic device 106 according to the present invention. In this configuration, the absorbing layer 115*a* is on the substrate 109 around the perimeter of the organic electronic device 112; the heat-activated adhesive 118 is on the absorbing layer 115*a* around the perimeter of the organic electronic device 112; and the absorbing layer 115*b* is on the heat-activated adhesive 118 around the perimeter of the organic electronic device 112. The encapsulation cover 121 is on the absorbing layer 115*b*. In one scenario, the absorbing layer 115*a* is deposited on the substrate 109 around the perimeter of the organic electronic device 112; the heat-activated adhesive 118 is deposited on the absorbing layer 115*a* around the perimeter of the organic electronic device 112; and the absorbing layer 115*b* is deposited on the heat-activated adhesive 118 around the perimeter of the organic electronic device 112.

Alternatively, instead of depositing the absorbing layer 115*a* on the substrate 109, depositing the heat-activated adhesive 118 on the absorbing layer 115*a*, and depositing the absorbing layer 115*b* on the heat-activated adhesive 118, the absorbing layer 115*a*, the heat-activated adhesive 118, and the absorbing layer 115*b* can be deposited on other components and in other sequences. For example, in another scenario, the absorbing layer 115*b* can be deposited on the encapsulation cover 121, the heat-activated adhesive 118 can be deposited on the absorbing layer 115*b*, and the absorbing layer 115*a* can be deposited on the heat-activated adhesive 118 and all three sealing components are deposited such that when the substrate 109 and the encapsulation cover 121 are brought together so as to seal the organic electronic device 112, the three sealing components are around the perimeter of the organic electronic device 112. In yet another scenario, the absorbing layer 115*a* can be deposited on the substrate 109, the heat-activated adhesive 118 can be deposited on the absorbing layer 115*a*, and the absorbing layer 115*b* can be deposited on the encapsulation cover 121 such that when the substrate 109 and the encapsulation cover 121 are brought together so as to seal the organic electronic device 112, the absorbing layer 115*b* is around the perimeter of the organic electronic device 112. In another scenario, the absorbing layer 115*a* can be deposited on the substrate 109, the absorbing layer 115*b* can be deposited on the encapsulation cover 121, and the heat-activated adhesive 118 can be deposited on the absorbing layer 115*b*. The absorbing layer 115*b* and the heat-activated adhesive 118 are deposited such that when the substrate 109 and the encapsulation cover 121 are brought together so as to seal the organic electronic device 112, these two sealing components are around the perimeter of the organic electronic device 112.

The absorbing layers 115*a,b* can be deposited using the selective or non-selective deposition techniques described earlier for the deposition of the absorbing layer 115*a*. Similarly, the heat-activated adhesive 118 can be deposited using the selective or non-selective deposition techniques described earlier.

In FIG. 2*c*, the IR source is localized IR source 124 located on the substrate-side of the encapsulated electronic device 106 and it supplies IR radiation 127 that is at least substantially transmitted through the substrate 109 and is at least substantially absorbed by the absorbing layer 115*a*. Due to the proximity of the absorbing layer 115*a* to the heat-activated adhesive 118, the heat absorbed by the absorbing layer 115*a* is at least partially transferred to the heat-activated adhesive 118. In addition, the IR radiation that is transmitted through the heat-activated adhesive 118 is at least substantially absorbed by the absorbing layer 115*b* and due to this absorbing layer's proximity to the heat-activated adhesive 118, the heat is at least substantially transferred back to the heat-activated adhesive 118. Alternatively, the absorbing layer 115*b* can be an IR reflective layer that reflects the IR radiation transmitted through the adhesive back to the adhesive and/or the absorbing layer 115*a*. The substrate 109 has the absorption and thermal conductivity properties described earlier for FIG. 2*a*.

Figure 2D:
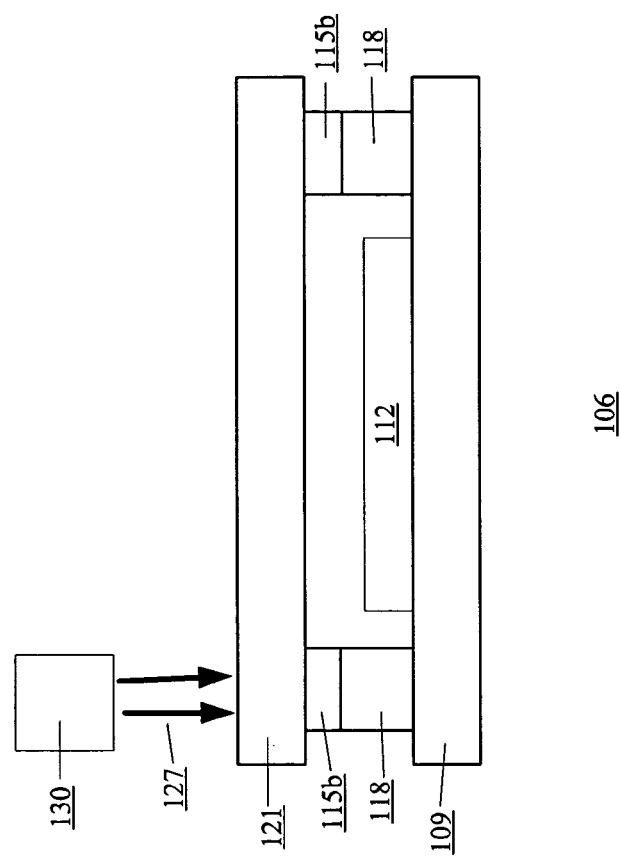
FIG. 2d shows a fourth configuration of the embodiment of the system used to produce the encapsulated organic electronic device according to the present invention.

FIG. 2*d* shows a fourth configuration of the embodiment of the system used to produce the encapsulated organic electronic device 106 according to the present invention. In this configuration, the absorbing layer 115*a* is on the substrate 109 around the perimeter of the organic electronic device 112, and the heat-activated adhesive 118 is on the absorbing layer 115a around the perimeter of the organic electronic device 112. The encapsulation cover 121 is on the heat-activated adhesive 118. The sealing components (e.g., the absorbing layer 115a and the heat-activated adhesive 118) can be deposited on the various components (e.g., the substrate 109, the absorbing layer 115a, the heat-activated adhesive 118, and the encapsulation cover 121) in the combinations described earlier for FIG. 2a.

In FIG. 2d, the IR source is localized IR source 130 located on the "encapsulation cover"-side of the encapsulated electronic device 106 and it supplies IR radiation 127 that is at least substantially transmitted through the encapsulation cover 121, and at least some of this radiation may be absorbed by the heat-activated adhesive 118. The IR radiation that is transmitted through the heat-activated adhesive 118 is at least substantially absorbed by the absorbing layer 115a and due to the absorbing layer's proximity to the heat-activated adhesive 118, the heat is at least substantially transferred back to the heat-activated adhesive 118. So that a greater percentage of the supplied IR radiation is absorbed by the heat-activated adhesive 118 and/or the absorbing layer 115a rather than the encapsulation cover 121, the absorption percentage of the IR radiation of the encapsulation cover 121 is less than the absorption percentage of the absorbing layer 115a; preferably, the absorption percentage of the encapsulation cover 121 is less than 50%, and more preferably, it is less than 10%. The encapsulation cover 121 and the substrate 109 have low thermal conductivity.

Figure 2E:
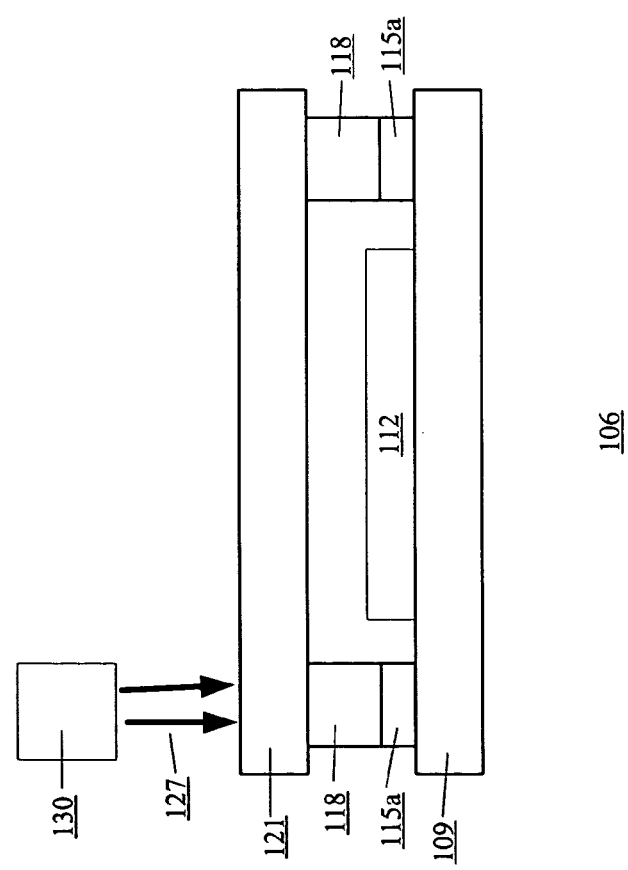
FIG. 2e shows a fifth configuration of the embodiment of the system used to produce the encapsulated organic electronic device according to the present invention.

FIG. 2e shows a fifth configuration of the embodiment of the system used to produce the encapsulated organic electronic device 106 according to the present invention. In this configuration, the heat-activated adhesive 118 is on the substrate 109 around the perimeter of the organic electronic device 112; and the absorbing layer 115b is on the heat-activated adhesive 118 around the perimeter of the organic electronic device 112. The encapsulation cover 121 is on the absorbing layer 115b. The sealing components (e.g., the heat-activated adhesive 118 and the absorbing layer 115b) can be deposited on the various components (e.g., the substrate 109, the heat-activated adhesive 118, the absorbing layer 115b, and the encapsulation cover 121) in the combinations described earlier for FIG. 2b.

In FIG. 2e, the IR source is localized IR source 130 located on the "encapsulation cover"-side of the encapsulated electronic device 106 and it supplies IR radiation 127 that is at least substantially transmitted through the encapsulation cover 121 and is at least substantially absorbed by the absorbing layer 115b. Due to the proximity of the absorbing layer 115b to the heat-activated adhesive 118, the heat absorbed by the absorbing layer 115b is at least partially transferred to the heat-activated adhesive 118. The encapsulation cover 121 has the absorption and thermal conductivity properties described earlier for FIG. 2d.

FIG. 2f shows a sixth configuration of the embodiment of the system used to produce the encapsulated organic electronic device 106 according to the present invention. In this configuration, the absorbing layer 115a is on the substrate 109, the heat-activated adhesive 118 is on the absorbing layer 115a, and the absorbing layer 115b is on the heat-activated adhesive 118 and all are around the perimeter of the organic electronic device 112. The encapsulation cover 121 is on the absorbing layer 115b. The sealing components (e.g., the absorbing layer 115a, the heat-activated adhesive 118, and the absorbing layer 115b) can be deposited on the various components (e.g., the substrate 109, the absorbing layer 115a, the heat-activated adhesive 118, the absorbing layer 115b, and the encapsulation cover 121) in the combinations described earlier for FIG. 2c.

In FIG. 2f, the IR source is localized IR source 130 located on the "encapsulation cover"-side of the encapsulated electronic device 106 and it supplies IR radiation 127 that is at least substantially transmitted through the encapsulation cover 121 and is at least substantially absorbed by the absorbing layer 115b and due to the proximity of the absorbing layer 115b to the heat-activated adhesive 118, the heat absorbed by the absorbing layer 115b is at least partially transferred to the heat-activated adhesive 118. In addition, the IR radiation that is transmitted through the heat-activated adhesive 118 is at least substantially absorbed by the absorbing layer 115a and due to this absorbing layer's proximity to the heat-activated adhesive 118, the heat is at least substantially transferred back to the heat-activated adhesive 118. Alternatively, the absorbing layer 115a can be an IR reflective layer that reflects the IR radiation transmitted through the adhesive back to the adhesive and/or the absorbing layer 115b. The encapsulation cover 121 has the absorption and thermal conductivity properties described earlier for FIG. 2d.

FIG. 2g shows a seventh configuration of the embodiment of the system used to produce the encapsulated organic electronic device 106 according to the present invention. In this configuration, the absorbing layer 115a is on the substrate 109, and the heat-activated adhesive 118 is on the absorbing layer 115a and both these sealing components are around the perimeter of the organic electronic device 112. The encapsulation cover 121 is on the heat-activated adhesive 118. The sealing components (e.g., the absorbing layer 115a and the heat-activated adhesive 118) can be deposited on the various components (e.g., the substrate 109, the absorbing layer 115a, the heat-activated adhesive 118, and the encapsulation cover 121) in the combinations described earlier for FIG. 2a.

In FIG. 2g, the IR source is the localized IR source 124 located on the substrate-side and the localized IR source 130 located on the "encapsulation cover"-side of the encapsulated electronic device 106. The IR source 124 located on the substrate-side supplies IR radiation 127 that is substantially transmitted through the substrate 109 and is at least substantially absorbed by the absorbing layer 115a. Due to the proximity of the absorbing layer 115a to the heat-activated adhesive 118, the heat absorbed by the absorbing layer 115a is at least partially transferred to the heat-activated adhesive 118. The IR source 130 located on the "encapsulation cover"-side supplies IR radiation 127 that is at least substantially transmitted through the encapsulation cover 121, and at least some of this radiation may be absorbed by the heat-activated adhesive 118. From this source, the IR radiation that is transmitted through the heat-activated adhesive 118 is at least substantially absorbed by the absorbing layer 115a and due to the absorbing layer's proximity to the heat-activated adhesive 118, the heat is at least partially transferred back to the heat-activated adhesive 118. So that a greater percentage of the supplied IR radiation is absorbed by the absorbing layer 115a rather than the substrate 109, the absorption percentage of the IR radiation of the substrate 109 is less than the absorption percentage of the absorbing layer 115a; preferably, the absorption percentage of the substrate 109 is less than 50%, and more preferably, it is less than 10%. So that a greater percentage of the supplied IR radiation is absorbed by the heat-activated adhesive 118 and/or the absorbing layer 115a rather than the encapsulation cover 121, the absorption percentage of the IR radiation of the encapsulation cover 121 is less than the absorption percentage of the absorbing layer 115a; preferably, the absorption percentage of the encapsulation cover 121 is less than 50%, and more preferably, it is less than 10%. The substrate 109 and the encapsulation cover 121 have low thermal conductivity.

FIG. 2h shows an eighth configuration of the embodiment of the system used to produce the encapsulated organic electronic device 106 according to the present invention. In this configuration, the heat-activated adhesive 118 is on the substrate 109 around the perimeter of the organic electronic device 112, and the absorbing layer 115b is on the heat-activated adhesive 118 around the perimeter of the organic electronic device 112. The encapsulation cover 121 is on the absorbing layer 115b. The sealing components (e.g., the heat-activated adhesive 118 and the absorbing layer 115b) can be deposited on the various components (e.g., the substrate 109, the heat-activated adhesive 118, the absorbing layer 115b, and the encapsulation cover 121) in the combinations described earlier for FIG. 2b.

In FIG. 2h, the localized IR source 124 located on the substrate-side supplies IR radiation 127 that is substantially transmitted through the substrate 109, and at least some of this radiation may be absorbed by the heat-activated adhesive 118. The IR radiation that is transmitted through the heat-activated adhesive 118 is at least substantially absorbed by the absorbing layer 115b and due to the absorbing layer's proximity to the heat-activated adhesive 118, the heat is at least partially transferred back to the heat-activated adhesive 118. The IR source 130 located on the "encapsulation cover"-side supplies IR radiation 127 that is at least substantially transmitted through the encapsulation cover 121 and is at least substantially absorbed by the absorbing layer 115b. Due to the proximity of the absorbing layer 115b to the heat-activated adhesive 118, the heat absorbed by the absorbing layer 115b is at least partially transferred to the heat-activated adhesive 118. The substrate 109 and the encapsulation cover 121 have the absorption and thermal conductivity properties described earlier for FIG. 2g.

FIG. 2i shows a ninth configuration of the embodiment of the system used to produce the encapsulated organic electronic device 106 according to the present invention. In this configuration, the absorbing layer 115a is on the substrate 109, the heat-activated adhesive 118 is on the absorbing layer 115a, and the absorbing layer 115b is on the heat-activated adhesive 118, and all these sealing components are around the perimeter of the organic electronic device 112. The encapsulation cover 121 is on the absorbing layer 115b. The sealing components (e.g., the absorbing layer 115a, the heat-activated adhesive 118, and the absorbing layer 115b) can be deposited on the various components (e.g., the substrate 109, the absorbing layer 115a, the heat-activated adhesive 118, the absorbing layer 115b, and the encapsulation cover 121) in the combinations described earlier for FIG. 2c.

In FIG. 2i, the localized IR source 124 located on the substrate-side supplies IR radiation 127 that is substantially transmitted through the substrate 109 and is at least substantially absorbed by the absorbing layer 115a and due to the absorbing layer's proximity to the heat-activated adhesive 118, the heat is at least partially transferred to the heat-activated adhesive 118. The IR source 130 located on the "encapsulation cover"-side supplies IR radiation 127 that is at least substantially transmitted through the encapsulation cover 121 and is at least substantially absorbed by the absorbing layer 115b and due to the proximity of the absorbing layer 115b to the heat-activated adhesive 118, the heat absorbed by the absorbing layer 115b is at least partially transferred to the heat-activated adhesive 118. The IR radiation that is transmitted through the heat-activated adhesive 118 is at least substantially absorbed by the corresponding absorbing layer 115a,b and the heat is at least substantially transferred back to the heat-activated adhesive 118. The substrate 109 and the encapsulation cover 121 have the absorption and thermal conductivity properties described earlier for FIG. 2g.

Figure 3:
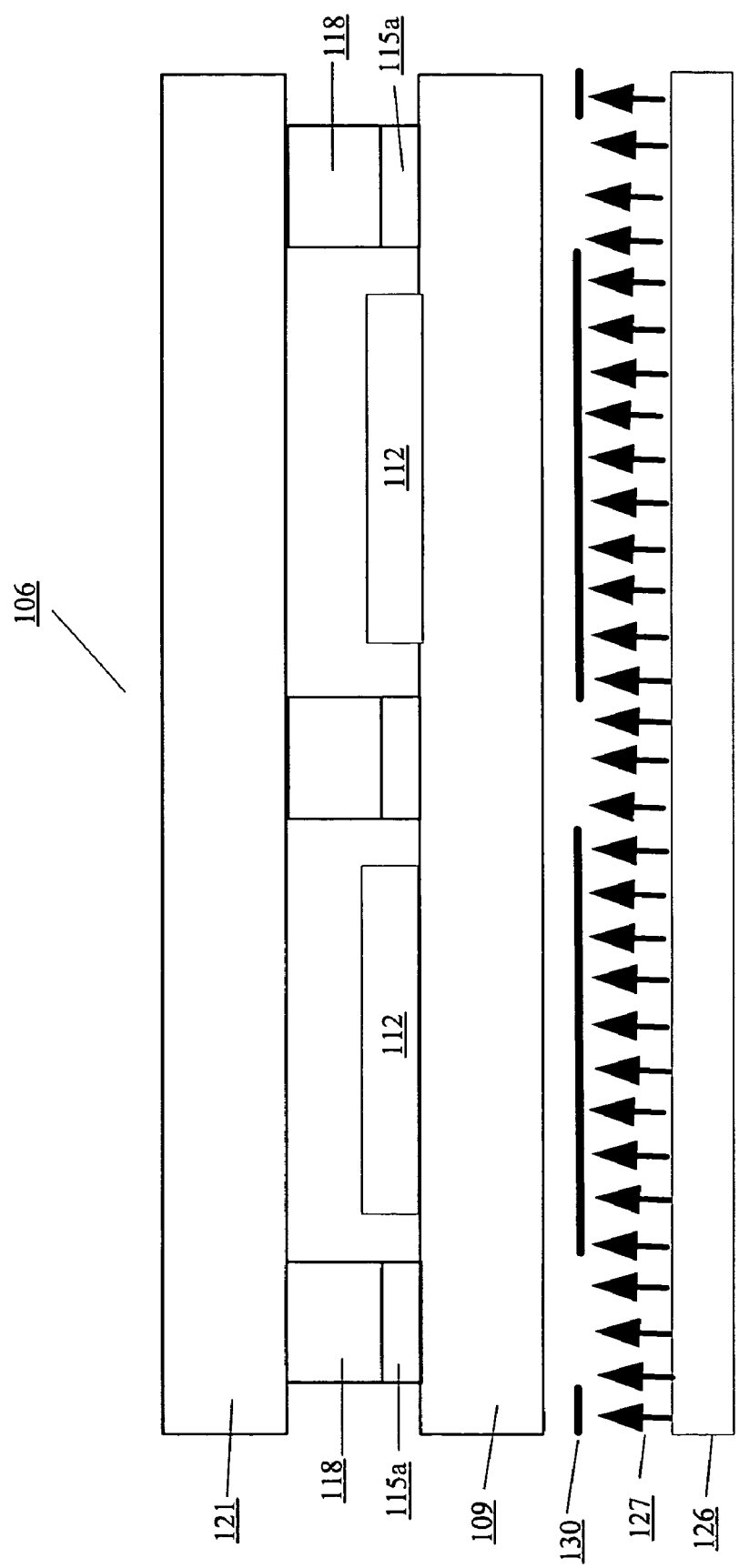
FIG. 3 shows another embodiment of the system used to produce the encapsulated organic electronic device according to the present invention.

FIG. 3 shows another embodiment of the system used to produce the encapsulated organic electronic device 106 according to the present invention. In FIG. 3, the IR flood source 126 is located on the substrate-side of the encapsulated electronic device 106, and the IR flood source 126 supplies the IR radiation 127. A mask 130 is on or above the substrate 109 (in FIG. 3, the mask is shown above) and is used to localize/pattern the IR radiation 127 so that substantially only the heat-activated adhesive 118 and/or the absorbing layer 115a is exposed to the IR radiation 127. The mask can either absorb or reflect the IR radiation 127. In one configuration, the IR flood source 126 is an areal IR source that supplies IR radiation in the x-y direction. In another configuration, the IR flood source 126 is a scanned linear source; the scanned linear source supplies a line of IR radiation. The IR radiation is swept across the entirety of the seal frame by either moving the electronic device across the scanned linear source, or by moving the scanned linear source across the electronic device. Alternatively, the IR flood source 126 can be located on the "encapsulation cover"-side of the encapsulated electronic device 106, and another mask is also on this side to localize/pattern the IR radiation 127. In addition, alternatively, the IR flood sources and the corresponding masks can be located on both the substrate-side and the "encapsulated cover"-side of the electronic device 106. The encapsulated electronic device 106 can be configured as shown in FIG. 3 (in this configuration, the absorbing layer 115a is on the substrate 109, and the heat-activated adhesive 118 is on the absorbing layer 115a; this configuration is similar to the configuration shown in FIG. 2a) or alternatively, it can be configured as shown in FIG. 2b or FIG. 2c.

FIG. 4 is a flowchart that shows an embodiment of a method to encapsulate the organic electronic device 112 according to the present invention. In block 503, an organic electronic device 112 is fabricated on a substrate 109. In block 506, optionally, a first absorbing layer is deposited on the substrate or the encapsulation cover. In block 509, the heat-activated adhesive is deposited on the first absorbing layer if present, the substrate, or the encapsulation cover. In block 512, optionally, a second absorbing layer is deposited on the heat-activated adhesive, the substrate, or the encapsulation cover. The first absorbing layer if present, the heat-activated adhesive, and the second absorbing layer if present can be deposited in any of the various combinations described for FIGS. 2a–c. The absorbing layer(s) and the heat-activated adhesive can be deposited using any of the deposition techniques described earlier. In block 515, the substrate and the encapsulation cover are brought closer together so as to encapsulate (i.e., seal) the organic electronic device. In block 518, the localized IR radiation is applied to the heat-activated adhesive to cure it. The first absorbing layer if present and the second absorbing layer if present absorb the IR radiation and transfer the generated heat to the heat-activated adhesive in order to cure it. The IR source that supplies the IR radiation can be located on the substrate-side and/or the IR source can be located on the "encapsulation cover"-side. If the IR source is on the substrate-side, then an absorption percentage of the substrate is less than an absorption percentage of the first absorbing layer if present and less than an absorption percentage of the second absorbing layer if present. If the IR source is on the "encapsulation cover"-side, then an absorption percentage of the encapsulation cover is less than an absorption percentage of the first absorbing layer if present and less than an absorption percentage of the second absorbing layer if present. The substrate and the encapsulation cover have a low thermal conductivity.

As any person of ordinary skill in the art of organic electronic device fabrication will recognize from the description, figures, and examples that modifications and changes can be made to the embodiments of the invention without departing from the scope of the invention defined by the following claims.

What is claimed:

1. An encapsulated organic electronic device, comprising:
a substrate;
an organic electronic device on said substrate;
a heat-activated adhesive on said substrate, said heat-activated adhesive surrounds a perimeter of said organic electronic device; and
an encapsulation cover on said heat-activated adhesive,
wherein at least one of: (1) a first absorbing layer is between said substrate and said heat-activated adhesive and in proximity to said heat-activated adhesive, and (2) a second absorbing layer is between said encapsulation cover and said heat-activated adhesive and in proximity to said heat-activated adhesive; and
wherein if an IR source that supplies IR radiation is on a substrate-side, then an IR radiation absorption percentage of said substrate is less than an absorption percentage of said first absorbing layer if present and less than an absorption percentage of said second absorbing layer if present; and
if an IR source that supplies said IR radiation is on an encapsulation cover-side, then an absorption percentage of said encapsulation cover is less than an absorption percentage of said first absorbing layer if present and less than an absorption percentage of said second absorbing layer if present.

2. The device of claim 1 wherein said first absorbing layer and said second absorbing layer are comprised of: a metal, an alloy, carbon, amorphous carbon, an absorbing organic material, a semiconductor, a dielectric doped with an absorbing material, a sub-stoichiometric dielectric, a nitride, or a photo-resist.

3. The device of claim 1 wherein said heat-activated adhesive is comprised of: a thermal-cure epoxy, a compound that is initially in a fluid phase and is converted by heat to a solid amorphous or crystalline phase compound, glass, glass-frit, a solder, or a glue that is at least partially cured by heat.

4. The device of claim 1 wherein
said absorption percentage of said first absorbing layer if present is at least 50%;
said absorption percentage of said second absorbing layer if present is at least 50%;
if said IR source is on said substrate-side, said absorption percentage of said substrate is less than 50%; and
if said IR source is on said encapsulation cover-side, said absorption percentage of said encapsulation cover is less than 50%.

5. The device of claim 4 wherein
said absorption percentage of said first absorbing layer if present is at least 70%;
said absorption percentage of said second absorbing layer if present is at least 70%;
if said IR source is on said substrate-side, said absorption percentage of said substrate is less than 10%; and
if said IR source is on said encapsulation cover-side, said absorption percentage of said encapsulation cover is less than 10%.

6. The device of claim 1 wherein said substrate and said encapsulation cover have a low thermal conductivity.

7. The device of claim 1 wherein upon exposing said heat-activated adhesive to IR radiation,
if said first absorbing layer is present, said heat-activated adhesive intermixes with said first absorbing layer to form a first intermixed layer between said first absorbing layer and said heat-activated adhesive, and
if said second absorbing layer is present, said heat-activated adhesive intermixes with said second absorbing layer to form a second intermixed layer between said heat-activated adhesive and said second absorbing layer.

8. The device of claim 1 wherein
said first absorbing layer if present is in physical contact with said heat-activated adhesive, and
said second absorbing layer if present is in physical contact with said heat-activated adhesive.

9. The device of claim 1 wherein said IR source that supplies IR radiation on the substrate-side is a localized IR source, and said IR source that supplies IR radiation on the encapsulation cover-side is said localized IR source.

10. The device of claim 9 wherein said localized IR source is an IR laser, an IR LED, an LED bar, or a hot object.

11. The device of claim 1 wherein
said IR source that supplies IR radiation on the substrate-side is an IR flood source and a mask is on or above said substrate to localize IR radiation from said IR source; and
said IR source that supplies IR radiation on the encapsulation cover-side is said IR flood source and another mask is on or above said encapsulation cover to localize the IR radiation from said IR source that supplies IR radiation on the encapsulation cover-side.

12. The device of claim 11 wherein said IR flood source is an areal IR source or a scanned linear source.

13. The device of claim 1 wherein said organic electronic device is an OLED display, an OLED light source for area illumination, an organic transistor, an organic light sensor, an organic solar cell, or an organic laser.

14. A method to encapsulate an organic electronic device, comprising:
fabricating said organic electronic device on a substrate;
optionally depositing a first absorbing layer on any one of: (1) said substrate or (2) said encapsulation cover;
depositing a heat-activated adhesive on any one of: (1) said first absorbing layer, (2) said substrate, or (3) said encapsulation cover;
optionally depositing a second absorbing layer on any one of: (1) said heat-activated adhesive, (2) said substrate, or (3) said encapsulation cover;
bringing together said substrate and said encapsulation cover such that said first absorbing layer if present, said heat-activated adhesive, second absorbing layer if present, said substrate, and said encapsulation cover contact each other to seal said organic electronic device and form an encapsulated organic electronic device, wherein the heat-activated adhesive surrounds a perimeter of said organic electronic device, one of the first absorbing layer is between said substrate and said heat-activated adhesive or said second absorbing layer is between is between said encapsulation cover and said heat-activated adhesive and in proximity to said heat-activated adhesive; and applying IR radiation to said heat-activated adhesive to cure said heat-activated adhesive, wherein at least one of: (1) said first absorbing layer is deposited, or(2) said second absorbing layer is deposited, and wherein if an IR source that supplies the IR radiation is on a substrate-side of the encapsulated organic electronic device during the step of applying IR radiation, then an IR radiation absorption percentage of said substrate is less than an absorption percentage of said first absorbing layer if present and less than an absorption percentage of said second absorbing layer if present; and if an IR source that supplies IR radiation is on an encapsulation cover-side of the encapsulated organic electronic device during the step of applying IR radiation, then an absorption percentage of said encapsulation cover is less than an absorption percentage of said first absorbing layer if present and less than an absorption percentage of said second absorbing layer if present.

15. The method of claim 14 wherein said first absorbing layer and said second absorbing layer are comprised of: a metal, an alloy, carbon, amorphous carbon, an absorbing organic material, a semiconductor, a dielectric doped with an absorbing material, a sub-stoichiometric dielectric, a nitride, or a photo-resist.

16. The method of claim 14 wherein said heat-activated adhesive is comprised of: a thermal-cure epoxy, a compound that is initially in a fluid phase and is converted by heat to a solid amorphous or crystalline phase compound, glass, glass-frit, a solder, or a glue that is at least partially cured by heat.

17. The method of claim 14 wherein
said absorption percentage of said first absorbing layer if present is at least 50%;
said absorption percentage of said second absorbing layer if present is at least 50%;
if said IR source is on said substrate-side, said absorption percentage of said substrate is less than 50%; and
if said IR source is on said encapsulation cover-side, said absorption percentage of said encapsulation cover is less than 50%.

18. The method of claim 17 wherein
said absorption percentage of said first absorbing layer if present is at least 70%;
said absorption percentage of said second absorbing layer if present is at least 70%;
if said IR source is on said substrate-side, said absorption percentage of said substrate is less than 10%; and
if said IR source is on said encapsulation cover-side, said absorption percentage of said encapsulation cover is less than 10%.

19. The method of claim 14 wherein said substrate and said encapsulation cover have a low thermal conductivity.

20. The method of claim 14 wherein upon applying IR radiation to said heat-activated adhesive,
if said first absorbing layer is present, said heat-activated adhesive intermixes with said first absorbing layer to form a first intermixed layer between said first absorbing layer and said heat-activated adhesive, and
if said second absorbing layer is present, said heat-activated adhesive intermixes with said second absorbing layer to form a second intermixed layer between said heat-activated adhesive and said second absorbing layer.

21. The method of claim 14 wherein said applied IR radiation is localized IR radiation.

22. The method of claim 14 wherein said first absorbing layer and said second absorbing layer are deposited using: screen printing, ink-jet printing, dispensing through a needle of a syringe, spin coating, thermal evaporation, sputtering, or chemical vapor deposition.

23. The method of claim 14 wherein said heat-activated adhesive is deposited using: screen printing, ink-jet printing, or dispensing through a needle of a syringe.

24. The method of claim 14 wherein said organic electronic device is an OLED display, an OLED light source for area illumination, an organic transistor, an organic light sensor, an organic solar cell, or an organic laser.

* * * * *

UNITED STATES PATENT AND TRADEMARK OFFICE
CERTIFICATE OF CORRECTION

PATENT NO. : 7,078,726 B2  Page 1 of 1
APPLICATION NO. : 10/939250
DATED : July 18, 2006
INVENTOR(S) : Karl Pichler and Kyle D. Frischknecht It is certified that error appears in the above-identified patent and that said Letters Patent is hereby corrected as shown below:

Column 15, Line 2 at Claim 14; replace:
"is between is between said encapsulation cover" with
--is between said encapsulation cover--

Signed and Sealed this

Fifth Day of June, 2007

JON W. DUDAS
*Director of the United States Patent and Trademark Office*